(12) United States Patent
Sullivan et al.

(10) Patent No.: US 6,958,533 B2
(45) Date of Patent: Oct. 25, 2005

(54) HIGH DENSITY 3-D INTEGRATED CIRCUIT PACKAGE

(75) Inventors: Gerard J. Sullivan, Newbury Park, CA (US); James R. Rau, deceased, late of Anaheim, CA (US); by Chris Rau, legal representative, Anaheim, CA (US); Larry R. Adkins, Tustin, CA (US); A. James Hughes, Tustin, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/054,374

(22) Filed: Jan. 22, 2002

(65) Prior Publication Data

US 2003/0137059 A1 Jul. 24, 2003

(Under 37 CFR 1.47)

(51) Int. Cl.⁷ ............................................... H01L 23/02
(52) U.S. Cl. ........................................................ 257/686
(58) Field of Search ................................. 257/678, 684, 257/685, 686, 693, 703, 723, 724, 730–732; 174/790, 796, 788, 741, 735, 736, 801–803

(56) References Cited

U.S. PATENT DOCUMENTS

| | | | |
|---|---|---|---|
| 3,614,541 A | * | 10/1971 | Farrand ......................... 361/730 |
| 3,631,325 A | * | 12/1971 | Wenz ............................ 361/705 |
| 4,214,292 A | * | 7/1980 | Johnson ......................... 361/721 |
| 4,502,098 A | * | 2/1985 | Brown et al. ................. 361/690 |
| 4,646,128 A | | 2/1987 | Carson et al. .................. 357/74 |
| 4,704,319 A | | 11/1987 | Belanger et al. .............. 428/209 |
| 4,764,846 A | | 8/1988 | Go ................................. 361/388 |
| 4,868,712 A | * | 9/1989 | Woodman ...................... 361/689 |
| 4,922,378 A | * | 5/1990 | Malhi et al. ................... 361/706 |
| 4,983,533 A | | 1/1991 | Go ..................................... 437/7 |
| 5,140,405 A | * | 8/1992 | King et al. ..................... 257/727 |
| 5,172,303 A | | 12/1992 | Bernardoni et al. .......... 361/396 |
| 5,222,014 A | | 6/1993 | Lin ................................. 361/414 |
| 5,266,833 A | * | 11/1993 | Capps ............................ 257/690 |
| 5,276,590 A | * | 1/1994 | Budman et al. ............... 361/796 |
| 5,514,904 A | * | 5/1996 | Onga et al. .................... 257/627 |
| 5,581,498 A | | 12/1996 | Ludwig et al. ................... 365/63 |
| 5,688,721 A | | 11/1997 | Johnson ......................... 437/203 |
| 5,701,233 A | | 12/1997 | Carson et al. ................. 361/735 |
| 5,754,405 A | * | 5/1998 | Derouiche ..................... 361/744 |
| 5,834,339 A | * | 11/1998 | Distefano et al. ............. 438/125 |
| 5,838,060 A | | 11/1998 | Comer .......................... 257/685 |
| 5,943,213 A | | 8/1999 | Sasov | 
| 5,998,864 A | | 12/1999 | Khandros et al. ............. 257/723 |
| 6,014,316 A | | 1/2000 | Eide ............................... 361/735 |
| 6,028,352 A | | 2/2000 | Eide ............................... 257/686 |
| 6,072,234 A | | 6/2000 | Camien et al. ................ 257/686 |
| 6,117,704 A | | 9/2000 | Yamaguchi et al. .......... 438/100 |
| 6,207,474 B1 | * | 3/2001 | King et al. ..................... 438/107 |
| 6,281,577 B1 | * | 8/2001 | Oppermann et al. .......... 257/724 |
| 6,314,541 B1 | * | 11/2001 | Seytter et al. ................. 714/748 |
| 6,457,515 B1 | * | 10/2002 | Vafai et al. ................... 165/80.4 |
| 6,507,109 B2 | * | 1/2003 | Kinsman ....................... 257/724 |

OTHER PUBLICATIONS

Gann, Keith D. "Neo–Stacking Technology" *HDI Magazine* Dec. 1999.

* cited by examiner

*Primary Examiner*—David A. Zarneke
(74) *Attorney, Agent, or Firm*—McDonnell Boehnen Hulbert & Berghoff LLP

(57) ABSTRACT

A slotted file is created by connecting two side walls and a back wall. The side walls have etched grooves facing directly across from each other. The platelet has flanges that fit into the grooves. In one embodiment, a completed cube is formed when the platelets fill the slotted file.

17 Claims, 3 Drawing Sheets

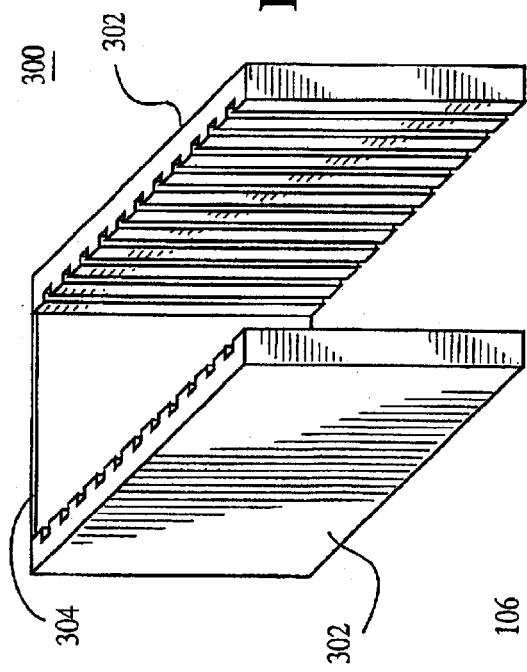
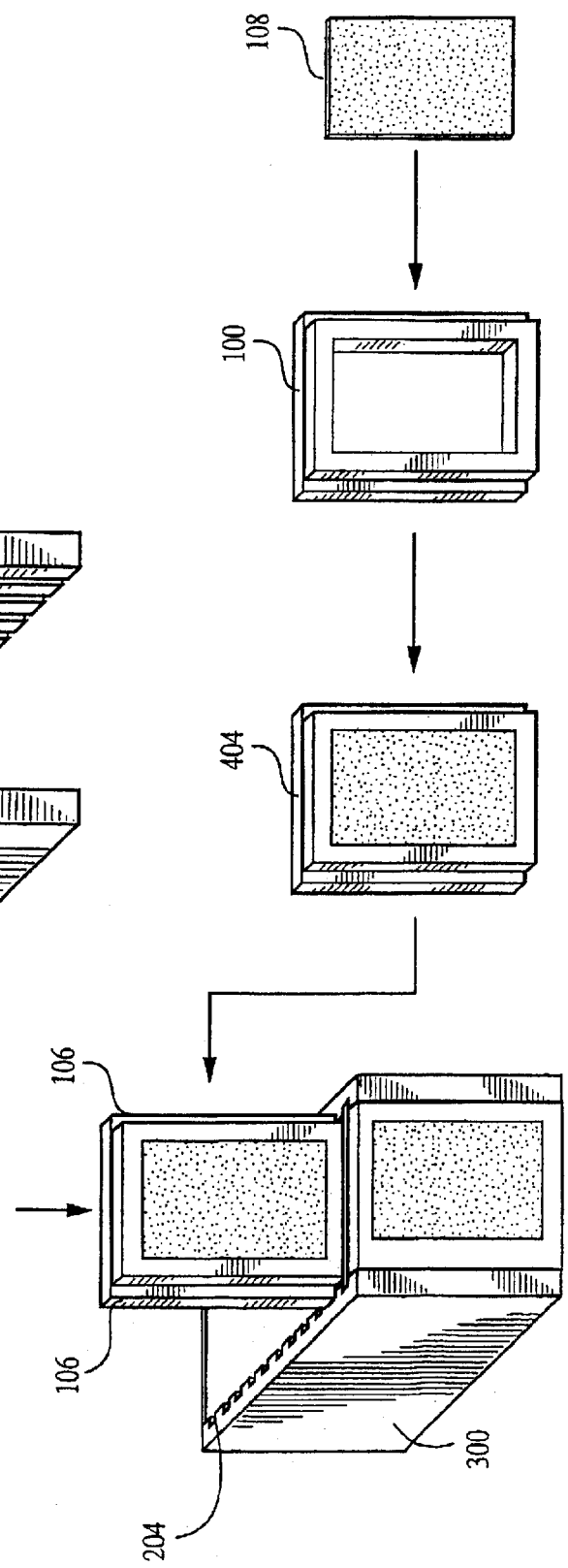

HIGH DENSITY 3-D INTEGRATED CIRCUIT PACKAGE

GOVERNMENT RIGHTS

The United States Government has acquired certain rights in this invention pursuant to Contract No. DASG60-90-C-0136 awarded by the U.S. Army.

FIELD

The present invention relates generally to circuit packages, and more particularly, relates to three-dimensional circuit packages that provide stacking for semiconductor platelets.

BACKGROUND

Three-dimensional integrated circuits are employed in applications in which space is a critical design factor. As the demand for more functionality in less space increases, so does the number of designs using three-dimensional packaging. In addition to the benefit of reducing space, these designs may also realize higher speeds because interconnects between circuit components may be shorter.

Memory stacking was the first application of three-dimensional packaging, but now applications range from stacking memory modules to stacking entire systems. Different layers in the stack may have different functionalities. For example, one layer may be a memory layer and another may be a logic layer. It is also possible that the different layers in the stack could have different dimensions.

These applications may require the precise stacking of very thin platelets into cubes. Platelets may consist of a semiconductor chip placed in a chip carrier. The platelets themselves may be less than 5 mils thick and there may be as many as sixty platelets stacked in one cube. It is critical that the spacing between the platelets is held to a very tight tolerance and that the platelets are not damaged during the stacking procedure.

Typically, the platelets are held in the cubical stack by a very thin layer of epoxy resin between each layer. This epoxy layer may be less than one micron thick. Other bonding materials, such as silicone rubber or eutectic solder alloy, may also be employed. The required spacing dimensions may be maintained by using an apparatus with a calibrated compression arm that applies pressure to the stack while the epoxy is setting. A typical amount of pressure may be ten Newtons of force. With this arrangement, only the overall cube dimensions can be maintained, and great care must be taken to prevent cracking the delicate platelets by excessive pressure. The critical layer to layer spacing is thus a derived property and is based upon the uniformity of the thickness and pressure-flow characteristics of the adhesive layer.

It would be desirable to provide a stacking method that provides a very tight spacing tolerance between the platelets and that minimizes damage to the platelets during the stacking process. The invention addresses current limitations and makes the critical spacing a directly controlled property resulting in much higher accuracy potential with a relative independence of the adhesive layers.

SUMMARY

In accordance with this invention, a method for stacking semiconductor platelets in a three-dimensional circuit package is described. Three walls are connected to form a slotted file. The two side walls have grooves. The grooves on the two walls face directly across from each other. Placing a semiconductor chip into a frame of a chip carrier forms a platelet. The frame is located on the surface of a floor of the chip carrier. The floor protrudes past the sides of the frame forming flanges on each side of the frame. The flanges fit into the groves of the slotted file. The platelets are then inserted into the slotted file forming a completed cube.

BRIEF DESCRIPTION OF THE DRAWINGS

Preferred embodiments are described below in conjunction with the appended drawing figures, wherein like reference numerals refer to like elements in the various figures, and wherein:

FIG. 3 is an illustration of an exemplary embodiment of a slotted file;

FIG. 4 is an illustration of the stacking process in an exemplary embodiment.

DETAILED DESCRIPTION

Figure 1:
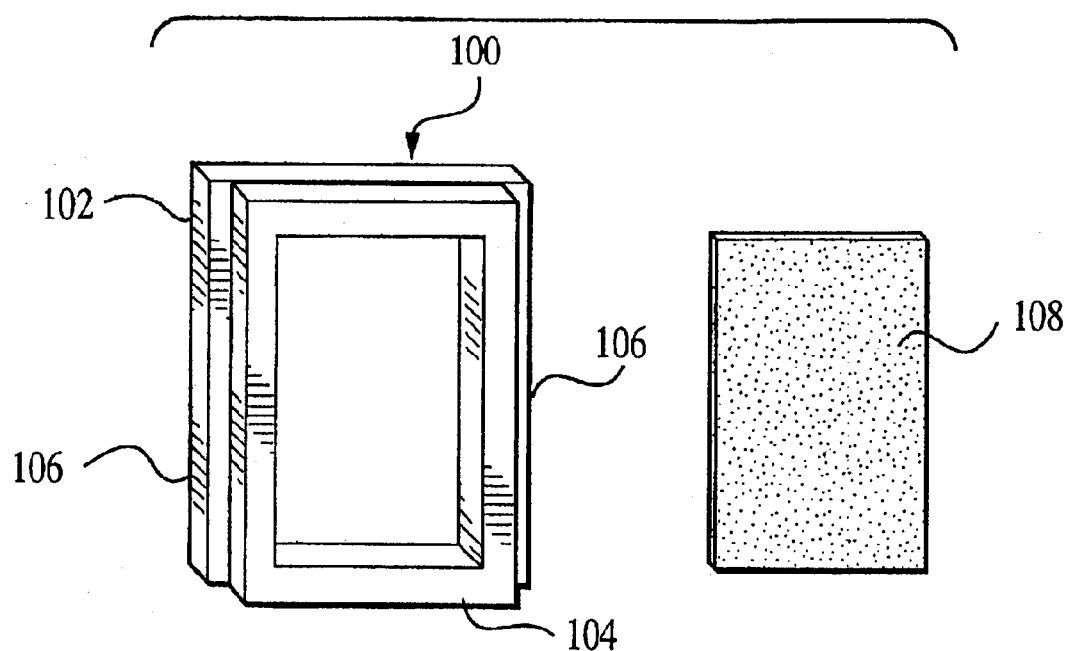
FIG. 1 is an illustration of an exemplary embodiment of a chip carrier and a semiconductor chip.

FIG. 1 is an illustration of an exemplary embodiment of a chip carrier 100 and a semiconductor chip 108. The chip carrier 100 is composed of a floor 102 and a frame 104. The chip carrier 100 may be designed to hold the semiconductor chip 108. The floor 102 may be a three-dimensional rectangle having a length, a width, and a thickness. The frame 104 may be a three-dimensional rectangle with a smaller three-dimensional rectangular center removed. The frame 104 has a length, a width, and a thickness. The frame 104 is substantially the same length as the floor 102; however, the frame 104 is not as wide as the floor 102.

The frame 104 is positioned in the center of the floor 102. Because the width of the floor 102 is greater than the width of the frame 104, the floor 102 protrudes past the edges of the frame 104 forming two flanges 106, one on either side of the frame 104.

In an exemplary embodiment both the floor 102 and the frame 104 are formed with ceramic materials, but other materials such as metal and plastic may be used. The floor 102 contains a plurality of electrodes. The frame 104 has interior dimensions slightly larger than those of the semiconductor chip 108. The interior dimensions of the frame 104 may vary to accommodate a variety of different semiconductor chip 108 dimensions. The semiconductor chip 108 may be placed in the frame 104 face down on the floor 102 contacting the plurality of electrodes at the appropriate circuit interfaces to form a platelet 404 (see FIG. 4).

Figure 2:
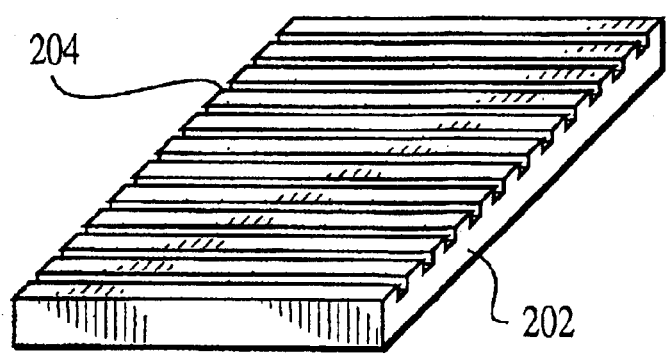
FIG. 2 is an illustration of an exemplary embodiment of a slotted file wall.

FIG. 2 is an illustration of a slotted file wall 200. A slotted file wall 200 consists of a wall material 202 and may include a plurality of grooves 204. The wall material 202 may be a three-dimensional rectangle having a length, a width, and a thickness. Silicon is the preferred wall material 202 in an exemplary embodiment, but other materials, such as gallium arsenide, may be used.

The wall material 202 may be etched with grooves 204 deep enough to receive the flanges 106 of a chip carrier 100 and less than the thickness of the wall material 202. For example, the depth of the grooves may be less than 10 mils thick. The spacing between the grooves 204 may be selected based on design requirements, such as the thickness of the platelets 404, the number of platelets 404 in a completed cube 500, and an allocated space limitation (see FIG. 5). For example, the allocated space limitation may be the size of an infrared sensor that contains a completed cube 500. Any etching technique that is compatible with the chosen wall material 202 may be used. A standard wet etch or plasma etch process that can produce a substantially straight wall trench may be suitable for this purpose.

FIG. 3 is an illustration of an exemplary embodiment of a slotted file 300. A slotted file 300 may consist of two side walls 302 and a back wall 304. Other embodiments may have additional walls. For example, a front wall, a top, or a bottom may also be part of the slotted file 300. The two side walls 302 may be etched with grooves 204. The back wall 304 may be a section of the wall material 202 that has not been etched with grooves 204. The dimensions of the slotted file 300 are based on the size of the platelets 404, the number of platelets 404 that will be placed in the slotted file 300, and the spacing between the platelets 404 in the slotted file 300 (see FIG. 4).

The back wall 304 may be connected to an end of each of the two side walls 302 to form a "U" shape. The grooves 204 on the two side walls 302 face directly across from each other. The three walls 302, 304 may be joined together by conventional methods to form a slotted file 300. For example, an etching process in which tabs and holes are created to join the walls may be employed.

FIG. 4 is an illustration of the stacking process in an exemplary embodiment. The semiconductor chip 108 is placed into the chip carrier 100 to form a platelet 404. For example, the platelet 404 may be less than 5 mils thick. Platelets 404 are then fitted into the slotted file 300 by inserting the flanges 106 into the opposing grooves 204. This may be accomplished by placing the platelet 404 in the vicinity of the opposing grooves 204 and using a shake table to slide the platelet into the opposing grooves 204. The spacing between the platelets 404 is maintained by the groove interval and no pressure is required to hold the chips in place because of the rigidity of the slotted file 300.

Figure 5:
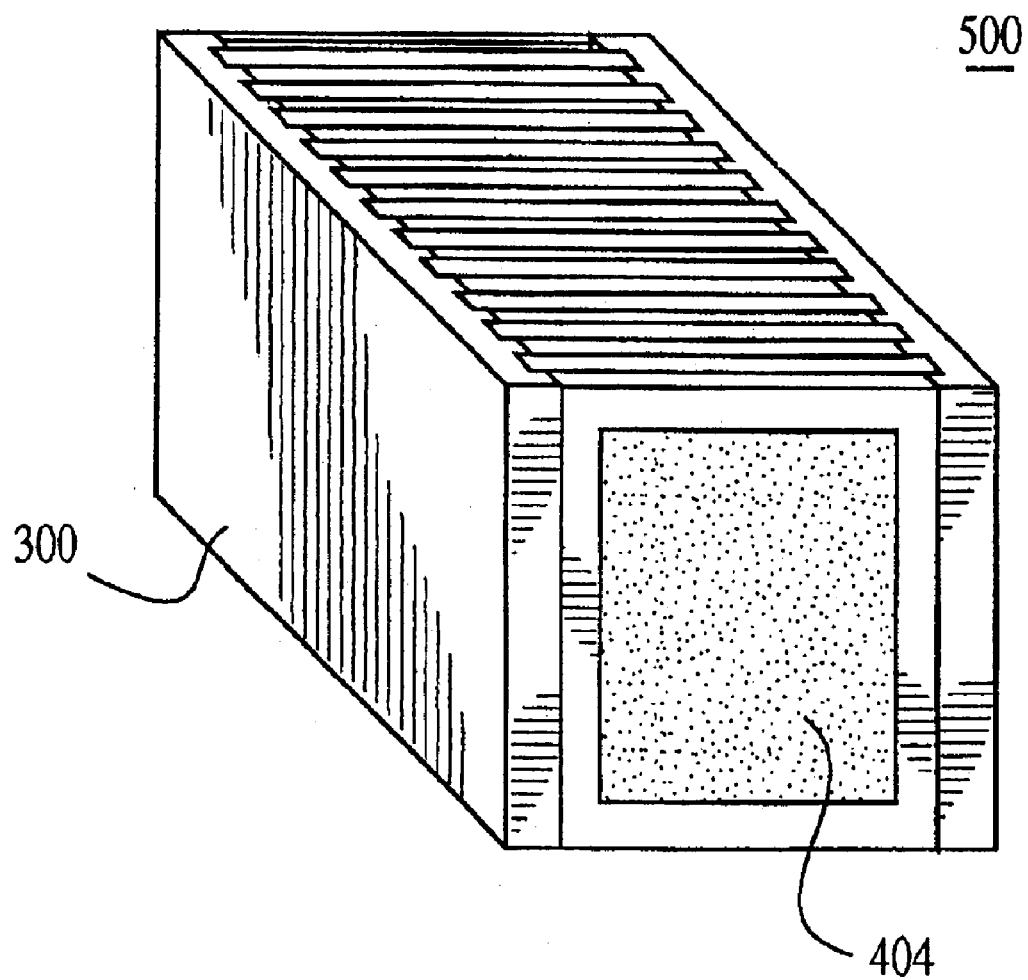
FIG. 5 is an illustration of an exemplary embodiment of a completed cube.

FIG. 5 illustrates the completed cube 500 after the platelets 404 have been inserted into the slotted file 300. By using a slotted cube arrangement, the platelets 404 are uniformly stacked without damage. There may be, for example, two hundred platelets 404 in the completed cube 500. The completed cube 500 may be made permanent by immersing the assembly in epoxy. To enable the epoxy to flow between substantially all the layers, the completed cube 500 may be placed in a vacuum chamber. Applying a hard vacuum to the chamber may force the epoxy through substantially all the cracks and layers.

It should be understood that the illustrated embodiments are exemplary only, and should not be taken as limiting the scope of the present invention.

We claim:

1. A system for three-dimensional packaging of platelets, comprising in combination;
   a slotted file; and
   a plurality of platelets which fit into the slotted file, wherein each of the platelets includes a semiconductor chip placed into a chip carrier so that the semiconductor chip contacts a plurality of electrodes located in the chip carrier, and wherein the platelets are stacked in the slotted file; and
   epoxy sealing the plurality of platelets into the slotted file to form a three-dimensional integrated circuit package.

2. The system at claim 1, wherein the slotted file has at least three walls.

3. The system of claim 2, wherein the at least three walls are composed of silicon.

4. The system of claim 2, wherein the slotted file has at least two side walls and at least one back wall.

5. The system of claim 4, wherein the at least two side walls have been etched with a plurality at grooves.

6. The system of claim 5, wherein a depth of the plurality of grooves is sufficient to hold each of the plurality of platelets.

7. The system of claim 5, wherein a spacing between the plurality of grooves is determined based on a platelet thickness.

8. The system of claim 5, wherein the spacing between the plurality of grooves is determined based on a number of platelets in the three-dimensional integrated circuit package.

9. The system of claim 5, wherein the spacing between the plurality of grooves is determined based on an allocated space limitation.

10. The system of claim 4, wherein the at least one back wall is connected to an end of each of the at least two side walls to form a "U " shape.

11. The system of claim 10, wherein the plurality of grooves on the at least two side walls face directly across from each other.

12. The system of claim 1, wherein the chip carrier has a floor and a frame.

13. The system of claim 12, wherein the floor end the frame are composed of a ceramic material.

14. The system of claim 12, wherein the floor protrudes past at feast two edges of the frame forming flanges.

15. The system of claim 14, wherein the flanges fit into the plurality of grooves in the at least two side walls of the slotted file.

16. The system of claim 12, wherein the floor includes the plurality of electrodes.

17. The system of claim 16, wherein the semiconductor chip is placed face down on the floor contacting the plurality of electrodes.

* * * * *

UNITED STATES PATENT AND TRADEMARK OFFICE
CERTIFICATE OF CORRECTION

PATENT NO. : 6,958,533 B2 Page 1 of 1
APPLICATION NO. : 10/054374
DATED : October 25, 2005
INVENTOR(S) : Gerard J. Sullivan It is certified that error appears in the above-identified patent and that said Letters Patent is hereby corrected as shown below:

Col 4, line 3, delete ";", replace with -- : --
Col 4, line 4, delete "and"
Col 4, line 13, delete "at", replace with -- of --
Col 4, line 20, delete "at", replace with -- of --
Col 4, line 41, delete "end", replace with -- and --
Col 4, line 44, delete "feast", replace with -- least --

Signed and Sealed this

Twentieth Day of February, 2007

JON W. DUDAS
*Director of the United States Patent and Trademark Office*